United States Patent
Lim et al.

(10) Patent No.: US 6,441,414 B1
(45) Date of Patent: Aug. 27, 2002

(54) FERROELECTRIC FIELD EFFECT TRANSISTOR, MEMORY UTILIZING SAME, AND METHOD OF OPERATING SAME

(75) Inventors: Myoungho Lim; Vikram Joshi; Jeffrey W. Bacon; Joseph D. Cuchiaro; Larry D. McMillan; Carlos A. Paz de Araujo, all of Colorado Springs, CO (US)

(73) Assignee: Symetrix Corporation, Colorado Springs, CO (US)

( * ) Notice: Subject to any disclaimer, the term of this patent is extended or adjusted under 35 U.S.C. 154(b) by 0 days.

(21) Appl. No.: 09/170,590

(22) Filed: Oct. 13, 1998

(51) Int. Cl.$^7$ ............................................. H01L 29/76
(52) U.S. Cl. ............................ 257/295; 438/3; 365/145
(58) Field of Search ...................... 365/145; 257/295; 438/3; 326/38

(56) References Cited

U.S. PATENT DOCUMENTS

| | | | |
|---|---|---|---|
| 2,791,758 A | | 5/1957 | Looney |
| 2,791,759 A | | 5/1957 | Brown |
| 2,791,760 A | | 5/1957 | Ross |
| 2,791,761 A | | 5/1957 | Morton |
| 2,876,436 A | | 3/1959 | Anderson |
| 4,873,664 A | | 10/1989 | Eaton, Jr. |
| 4,888,630 A | * | 12/1989 | Paterson ..................... 257/295 |
| 4,888,733 A | | 12/1989 | Mobley |
| 5,060,191 A | * | 10/1991 | Nagasaki et al. ............. 365/145 |
| 5,070,026 A | * | 12/1991 | Greenwald et al. ............. 438/3 |
| 5,361,224 A | * | 11/1994 | Takasu ......................... 257/295 |
| 5,365,094 A | * | 11/1994 | Takasu ......................... 257/295 |
| 5,384,729 A | * | 1/1995 | Sameshima .................. 365/145 |
| 5,515,311 A | | 5/1996 | Mihara |
| 5,523,964 A | | 6/1996 | McMillan et al. |
| 5,541,870 A | * | 7/1996 | Mihara et al. ............... 365/145 |
| 5,559,733 A | | 9/1996 | McMillan et al. |
| 5,744,374 A | | 4/1998 | Moon |
| 5,789,775 A | * | 8/1998 | Evans, Jr. et al. ........... 257/295 |
| 5,959,879 A | | 9/1999 | Koo |
| 6,025,735 A | * | 2/2000 | Gardner et al. ................ 326/38 |
| 6,067,244 A | * | 5/2000 | Ma et al. ..................... 365/145 |

FOREIGN PATENT DOCUMENTS

| | | | |
|---|---|---|---|
| EP | 0 869 557 A2 | 10/1998 | |
| JP | 4-256361 | 9/1992 | |
| JP | 08-255879 A | * 10/1996 | ................... 27/10 |
| JP | 11-17127 | 1/1999 | |
| WO | WO96/13860 | 5/1996 | |

OTHER PUBLICATIONS

Auciello et al., "The Physics Of Ferroelectric Memories," Physics Today, American Institute of Physics (Woodbury, New York), vol. 51 (No. 7), pp. 22–27 (Jul., 1998).

Hirai et al., "Formation of Metal / Ferroelectric / Insulator / Semiconductor Structure with a CeO2 Buffer Layer," Jpn. J. Appl. Phys., vol. 33 (No. 9B), pp. 5219–5221 (Sep., 1994).

Hirai et al., "Characterization of Metal / Ferroelectric / Insulator / Semiconductor Structure with CeO2 Buffer Layer," Jpn. J. Appl. Phys., vol. 34 (No. 8A), pp. 4163–4166 (Aug., 1995).

(List continued on next page.)

Primary Examiner—Long Pham
Assistant Examiner—William David Coleman
(74) Attorney, Agent, or Firm—Patton Boggs LLP (57) ABSTRACT

A ferroelectric non-volatile memory in which each memory cell consists of a single electronic element, a ferroelectric FET. The FET includes a source, drain, gate and substrate. The fact that the drain to source current, Ids, is always negative if a substrate to drain bias, Vss, of 0.8 volts or more is applied, permits the creation of a read and write truth table. A gate voltage equal to one truth table logic value is applied via a column decoder and a substrate bias equal to another truth table logic value is applied via a row decoder to write to the memory a resultant Ids logic state, which can be read whenever a voltage is placed across the source and drain.

5 Claims, 11 Drawing Sheets

OTHER PUBLICATIONS

Kim et al., "Memory window of Pt/SrBi2Ta2O9/CeO2/SiO2/Si structure for metal ferroelectric insulator semiconductor field effect transistor," Appl. Phys. Lett., American Institute of Physics, vol. 71 (No. 24), pp. 3507–3509 (Dec. 15, 1997).

Nakamura et al., "Preparation of Pb(Zr,Ti)O3 thin films on electrodes including IrO2," Appl. Phys. Lett., American Institute of Physics, vol. 65 (No. 12), pp. 1522–1524 (Sep. 19, 1994).

Scott et al., "Intergrated Ferroelectrics," Condensed Matter News, vol. 1 (No. 3), pp. 16–20 (1992).

Shin et al., "A Proposal of Pt/SrBi2Ta2O9/CeO2/Si Structure for Non Destructive Read Out Memory Devices," Extended Abstracts of the 1997 International Conference on Solid State Devices and Materials, Hamamatsu, pp. 32–33 (1997).

Shu–Yau Wu, "A New Ferroelectric Memory Device, Metal–Ferroelectric–Semiconductor Transistor," IEEE Transactions on Electron Devices, vol. 21 (No. 8), pp. 499–504 (Aug., 1974).

* cited by examiner

FERROELECTRIC FIELD EFFECT TRANSISTOR, MEMORY UTILIZING SAME, AND METHOD OF OPERATING SAME

BACKGROUND OF THE INVENTION

1. Field of the Invention

This invention relates to ferroelectric field effect transistors, and more particularly to ferroelectric memories utilizing such transistors and methods of operating such transistors and memories.

2. Statement of the Problem

It has been known since at least the 1950's that if a practical ferroelectric memory could be made, it would provide a fast, dense, non-volatile memory that could be operated at relatively low voltages. See Orlando Auciello, et al., "The Physics of Ferroelectric Memories", *Physics Today*, July 1998, pp. 22–27. The principal type of ferroelectric memory being explored today is the non-volatile ferroelectric random access memory or NVFRAM. Ibid. A disadvantage of the NVFRAM is that, in the process of reading it, the information it holds is destroyed and, therefore, the read function must be followed by a rewrite function. However, it has been postulated for at least 40 years that it may be possible to design a memory in which the memory element is a ferroelectric field effect transistor (FET), which memory could be non-destructively read. See Shu-Yau Wu, "A New Ferroelectric Memory Device, Metal-Ferroelectric-Semiconductor Transistor", in *IEEE Transactions On Electron Devices*, pp. 499–504, August 1974; S. Y. Wu, "Memory Retention and Switching Behavior Of Metal-Ferroelectric-Semiconductor Transistors", in *Ferroelectrics*, Vol. 11, pp. 379–383, 1976; and J. R. Scott, C. A. Paz De Araujo, and L. D. McMillan, "Integrated Ferroelectrics", in *Condensed Matter News*, Vol. 1, No. 3, pp. 15–20, 1992. Because the ferroelectric memory effect measured in the early devices of Wu was only a temporary, single state effect rather than a long lived two state effect, it is now believed that this effect was charge injection effect rather than an effect due to ferroelectric switching. However, recently a metal-ferroelectric-insulator-semiconductor FET device, i.e. a MFISFET, has been reported that appears to show true ferroelectric memory behavior. See Tadahiko Hirai, et al., "Formation of Metal/Ferroelectric/Insulator/Semiconductor Structure With A $CeO_2$ Buffer Layer", in *Japan Journal of Applied Physics*, Vol. 33, Part I, No. 9B, pp. 5219–5222, September 1994; Tadahiko Hirai, et al., "Characterization of Metal/Ferroelectric/Insulator/Semiconductor Structure With A $CeO_2$ Buffer Layer", in *Japan Journal of Applied Physics*, Vol. 34, Part I, No. 8A, pp. 4163–4166, August 1995; Yong Tae Kim, et al., "Memory Window of $Pt/SrBi_2Ta_2O_9/CeO_2/SiO_2/Si$ Structure For Metal Ferroelectric Insulator Semiconductor Field Effect Transistor", *Applied Physics Letters*, Vol. 71 No. 24, 15 December 1997, pp. 3507–3509; and U.S. Pat. No. 5,744,374 issued Apr. 28, 1998 to Jong Moon.

To make a memory requires not only a memory element, but also a means for addressing a large number of memory elements. Initially, it was believed that a ferroelectric memory element might be addressed by a simple array of rows and columns of conductors. A ferroelectric memory element, it was thought, could be located at each of the junctures of the array and addressed by applying a voltage to the conductors for the corresponding row and column. It was believed that if the voltage on each conductor was less than the threshold voltage for ferroelectric switching (coercive voltage) and the voltage difference between the conductors was greater than the coercive voltage, then only the selected cell would be written to or read, and the other cells would remain unchanged. However, it was found that this did not work because the neighboring unselected cells were disturbed by the voltages on the address lines. Thus, a switch was added between one of the address lines and each ferroelectric memory element. See U.S. Pat. No. 2,876,436 issued on Mar. 3, 1959 to J. R. Anderson and U.S. Pat. No. 4,873,664 issued on Oct. 10, 1989 to S. Sheffield Eaton, Jr. If the switch is a transistor as in the latter patent, the memory assumes a memory address architecture essentially the same as that of a conventional DRAM. However, when applied to a ferroelectric memory, even this architecture disturbed the memory cells attached to the same plate line as the addressed cell. That is, it has been found that ferroelectric materials do not have a sharp coercive threshold voltage, but rather even a small voltage will cause the ferroelectric to partially switch and, therefore, the repetitive application of small disturb voltages, such as occur in a conventional memory array, eventually causes the change or loss of a memory state. Therefore, a more complex architecture was proposed to overcome this disturb. See, for example, U.S. Pat. No. 4,888,733 issued on Dec. 19, 1989 to Kenneth J. Mobley.

The above address schemes are all for a NVFRAM; that is, a memory utilizing a ferroelectric capacitor as a memory element, rather than for a memory utilizing a ferroelectric FET. Insofar as known to applicants, the only address architecture disclosed up to now for a memory in which the memory element is a ferroelectric FET is shown in FIG. 1 of U.S. Pat. No. 5,523,964 issued on Jun. 4, 1996 to McMillan, et al. Like the Mobley, et al., architecture, to avoid the disturb problem, this architecture is relatively complex, utilizing five transistors in each memory cell in addition to the ferroelectric FET. Such complex architecture results in a memory that is much less dense and slower than, for example, a conventional DRAM. Thus, it appears that the fact that the ferroelectric material does not have a sharp coercive field threshold and can be switched by repetitive applications of a small voltage has made several of the original objectives of research into ferroelectric memories unattainable. It would, therefore, be highly desirable to provide a simpler architecture and method for addressing a ferroelectric memory.

SUMMARY OF THE INVENTION

The invention solves the above problem by providing a method and apparatus for addressing a ferroelectric memory in which there are no additional electric elements in the individual memory cell; that is, it provides an architecture in which each memory cell preferably contains only the ferroelectric memory element, e.g. the ferroelectric FET.

A memory cell can be written to by applying an electrical pulse to the gate and an electrical bias between another two electrical elements of the cell.

In the preferred embodiment, the ferroelectric memory element is a ferroelectric FET and the write bias is applied between the substrate and the FET source.

In one preferred embodiment, the sources of all cells in an array are held at a common voltage and the substrate voltage is used to select the cells to be written to. Preferably, the drain voltage is used to select which logic state is to be written to an individual cell.

In another preferred embodiment, the drains of all cells in the array are held at a common voltage and the source voltage is used to select the cells to be written to. Preferably, the substrate voltage is used to select which logic state is to be written to an individual cell.

A truth table provides a unique drain to source current for each combination of write bias with the pulse on the gate. A unique logic state is associated with the unique drain to source current.

Preferably, the cell is read by sensing the source/drain current when a voltage difference is placed across the source and drain.

A new ferroelectric memory cell structure and fabrication process is also provided to ensure that the substrate of each cell can be electrically isolated from the substrate of the other cells.

The invention not only provides a simpler and much more dense ferroelectric memory, but also provides one that can be manufactured easily. Numerous other features, objects and advantages of the invention will become apparent from the following description when read in conjunction with the accompanying drawings.

DETAILED DESCRIPTION OF THE PREFERRED EMBODIMENT

1. Introduction

Figure 1:
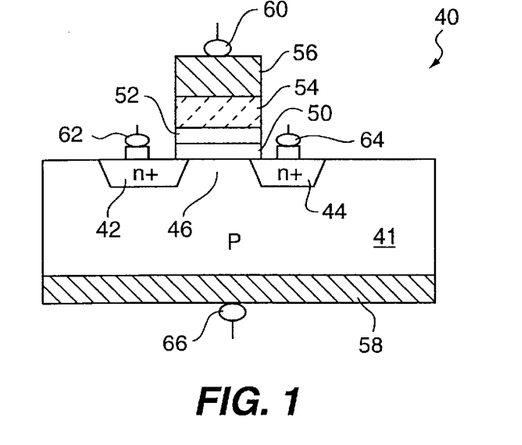
FIG. 1 shows cross-sectional view of a preferred embodiment of a ferroelectric FET according to the invention illustrating the various electrical contacts associated with the FET.

Directing attention to FIG. 1, a cross-sectional view of a portion of a ferroelectric FET 40 according to the invention is shown. The FET 40 includes a substrate 41 which is preferably p-type silicon. Highly doped areas 42 and 44, preferably n-type, are formed in the substrate 40. We shall refer to these doped areas 42 and 44 herein as source/drains since they can either be a source or a drain depending on the relative voltages applied to the areas. A channel region 46, preferably also n-type but not as highly doped as source/drains 42 and 44, is formed between the source/drains 42 and 44. Insulating layers 50 and 52 are preferably formed on substrate 41 above the channel region 46. A ferroelectric layer 54 is formed above channel 46, preferably on insulator 52, and a gate electrode 56 is formed on ferroelectric 54. A conductor 58 is formed on the bottom of substrate 41. Wiring layers form electrical contacts 60, 62 and 64 to gate 56, source/drain 42, and source/drain 64, respectively. A contact 66 is also shown adjacent conductor 58 to illustrate that this is the contact to the substrate in this embodiment. As will be described in more detail below, in the preferred embodiment, the cell is written to by applying an electrical bias to layer 58 via contact 66.

It should be understood that the FIGS. 1, 3–4, 6–11 and 27–30 depicting integrated circuit devices are not meant to be actual plan or cross-sectional views of any particular portion of an actual integrated circuit device. In the actual devices, the layers will not be as regular and the thickness may have different proportions. The figures instead show idealized representations which are employed to more clearly and fully depict the structure and process of the invention than would otherwise be possible.

Figure 2:
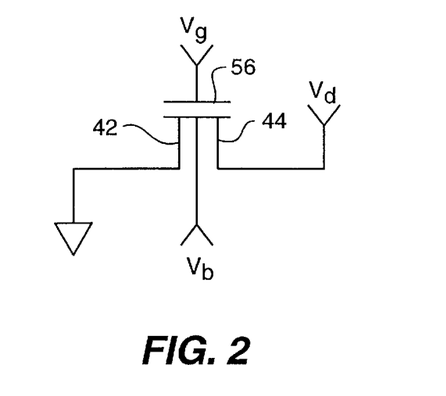
FIG. 2 is an equivalent circuit diagram of the ferroelectric FET of FIG. 1.

FIG. 2 shows the equivalent circuit for the preferred embodiment of the ferroelectric FET of FIG. 1. In the preferred embodiment, source 42 is held at ground, and the bias voltage, Vb, used to select and deselect the cell is applied to the substrate 41. A drain bias voltage, Vd, is applied to drain 44 in the read process, and a gate bias voltage, Vg, is applied to gate 56 to program the cell.

Figure 3:
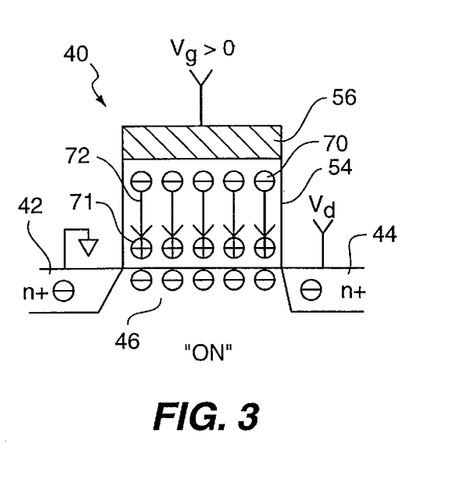
FIG. 3 illustrates the state of polarization of the ferroelectric material and the resulting channel state for the FET of FIG. 1 for the "ON" state.
Figure 4:
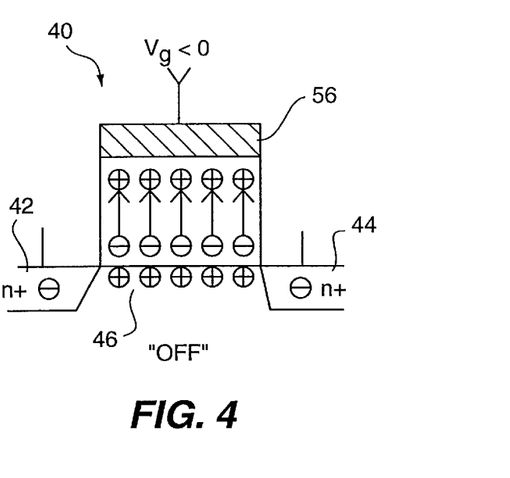
FIG. 4 illustrates the state of polarization of the ferroelectric material and the resulting channel state for the FET of FIG. 1 for the "OFF" state.

FIG. 3 illustrates the state of polarization of the ferroelectric material 54 and the resulting state of channel 46 for the FET 40 for the "ON" state, while FIG. 4 illustrates the state of polarization of the ferroelectric material 54 and the resulting state of channel 46 for the FET 40 for the "OFF" state. For sake of clarity, the insulating material(s) are not shown in these figures. In these figures, the circles with minus signs, such as 70, represent electrons, the circles with plus signs, such as 71, represent positive ions or vacancies, and the arrows, such as 72, represent the direction of polarization charge. If the an electric field is applied to the FET 40 in the upward direction in the figures, that is, if a positive voltage is applied to gate 56, then the ferroelectric material 54 will develop a polarization as shown in FIG. 3. Preferably, this gate voltage is in the range from about 1 volt to 15 volts, and most preferably in the range of about 3–5 volts. If the voltage is equal to or greater than the coercive voltage, essentially all the ferroelectric domains in the material 54 will become polarized as shown, but even a small voltage, e.g. 1.0 volt or higher, will cause some domains to switch. The positive polarization charge above the channel 46 will induce electrons into the channel, which, since electrons are the carriers in the n-type material, will greatly increase the conductivity of the channel. Assuming a drain bias, Vd, preferably in the range of about 0.5 Volts to 8 volts, the increased conductivity of channel 46 will result in a greatly increased drain to source current, which is sensed to detect the "ON" state, which we will arbitrarily call a logic "1" state herein. If an electric field is applied to the FET 40 in the downward direction in the figures, that is, if a negative voltage is applied to gate 56, then the ferroelectric material 54 will develop a polarization as shown in FIG. 3. The negative polarization charge above the channel 46 will induce a positive charge into the channel, which depletes the carriers in the n-type material, and will greatly decrease the conductivity of the channel. Assuming a drain bias, Vd, the decreased conductivity of channel 46 will result in a greatly decreased drain to source current, which is sensed to detect the OFF state, which we will arbitrarily call a logic "0" state herein.

Figure 5:
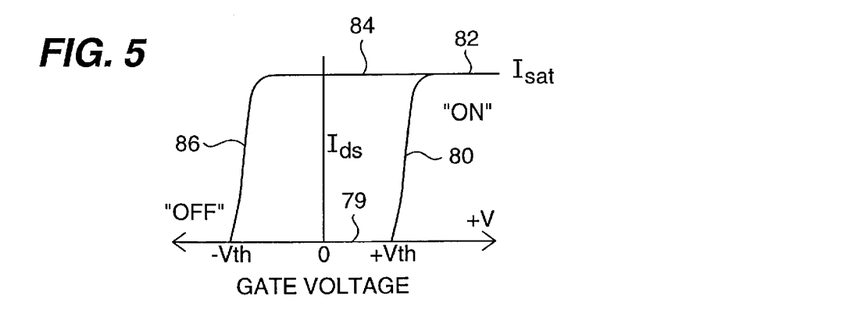
FIG. 5 illustrates a graph of drain to source current versus gate voltage for an idealized ferroelectric FET.

FIG. 5 shows an idealized hysteresis curve, i.e. a graph of gate voltage versus drain current, of a ferroelectric FET, such as 40. Starting at a zero gate voltage, there is essentially no drain current, because the resistance in the channel 46 is very high. As the gate voltage increases, there remains no drain current until a positive threshold voltage, +Vth, is reached. At this voltage, the ferroelectric 56 switches into the ON state and attracts carriers into the channel 46 causing a drain current. Then, as the gate voltage continues to increase, the drain current increases linearly along curve 80 until a saturation current is approached. After saturation, as the gate voltage increases, there is no increase in current, and the curve continues flat along line 82. As the gate voltage is decreased, the drain current remains the same until a negative threshold voltage, –Vth, is approached. Then the drain current decreases linearly along curve 86 until it approaches the point where the ferroelectric switches into the OFF state, at which point the drain current goes to zero. The drain current remains at zero no matter how large a negative voltage is applied, and, as the voltage is increased, does not rise above zero until the positive threshold voltage is reached.

The area between lines 79, 80, 84, and 86 is called the "memory window". To obtain a workable memory device, the width of the memory window, i.e. +Vth--Vth, must be greater than the noise in the gate electrode 56, and the height of the memory window, i.e. lsat, must be greater than the noise in the drain and associated sense circuit. For a nonvolatile memory, the zero volts line should ideally be centered in the memory window, or at least well within the noise margins, since the device should retain the data without external power. A high ratio of lds in the ON state and lds in the OFF state is also desirable to permit ease of discrimination of the two states by the sensing circuit.

2. The Fabrication Process

Figure 6:
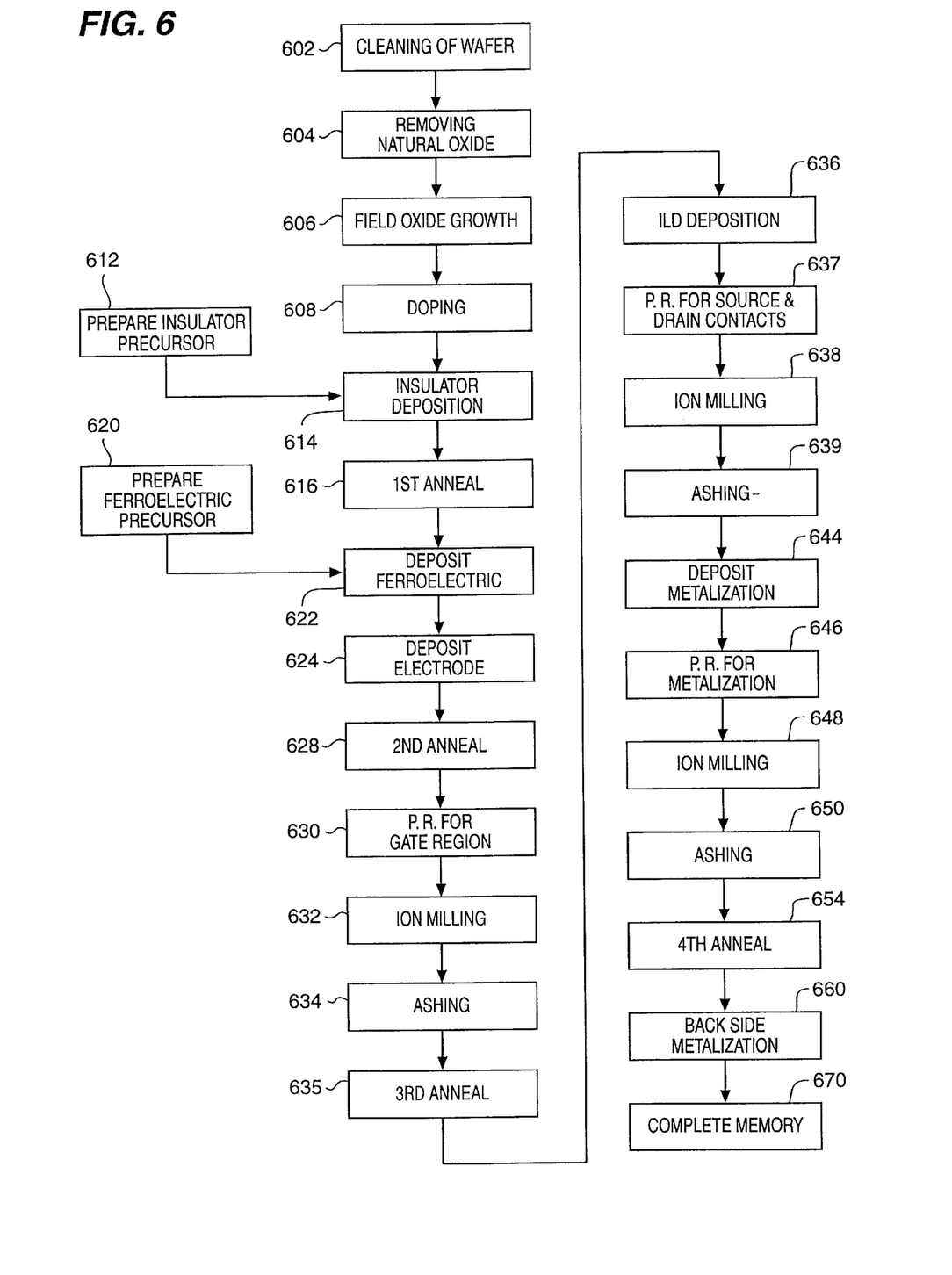
FIG. 6 is a flow chart of a preferred process for fabricating the ferroelectric FET of FIG. 1.

A flow chart showing the steps of a preferred process for fabricating a memory 330 (FIG. 33) including the FET 40 according to the invention is shown in FIG. 6, and a FET 40 in progressive stages of fabrication is shown in FIGS. 7–12. The word "substrate" is often used ambiguously in the art. It can mean the underlying wafer 41 on which an integrated circuit is formed as well as any object on which a thin film layer is deposited. In this disclosure, "substrate" shall mean the object to which the layer of interest is applied; for example, when we are talking about a ferroelectric layer, such as 54, the substrate includes the layers 41, 50 and 52 on which the ferroelectric layer is formed. In the art, the word "precursor" can mean a solution containing one metal which is mixed with other "precursors" to form the solution to be applied to the substrate, or the solution which is applied to a substrate. In this discussion, we shall generally refer to the individual precursors that are mixed to form the solution that is applied to the substrate as "initial precursors" and the precursor as applied to the substrate as the "final precursor" or just "precursor", unless the meaning is clear from the context. In intermediate stages, the solution may be referred to as the "intermediate precursor". The term "thin film" is used herein as it is used in the integrated circuit art. Generally, it means a film of less than a micron in thickness. The thin films disclosed herein are in all instances 0.5 microns in thickness or less. These thin films of the integrated circuit art should not be confused with the so called "thin films" in layered capacitors of the macroscopic capacitor art which are formed by a wholly different process which is incompatible with the integrated circuit art.

In step 602, a wafer 41 is provided and cleaned to remove contaminants, preferably by dipping the wafer into $H_2SO_4$ for 30 minutes. Then, in step 604, the wafer is dipped into 10:1 BOE for five minutes, which removes any natural oxide that may have formed on the wafer. In step 606, field oxide 90 (FIG. 7) is grown in a furnace, preferably to a thickness of 500 nanometers (nm). The source/drain regions 44 and 46 and the channel region 46 are then formed by a conventional doping method in step 608. This includes the usual photo resist, etching and strip steps for removal of the field oxide followed preferably by a phosphorous diffusion step. Preferably, the doping of channel region 46 is in the range of $2 \times 10^{15}$ to $10^{17}$ atoms/cm$^3$, and most preferably in the range $10^{16}$ to $10^{17}$ atoms/cm$^3$, which provides a resistance of about 1 ohm to 5 ohms. Preferably, the doping of the source/drain regions is in the range of $10^{19}$ to $10^{20}$ atoms/cm$^3$.

In steps 612 and 620, the initial precursors for depositing the insulator 52 and the ferroelectric 54, respectively, are formed. These may be formed by interacting each of the metals, e.g., cerium for the insulator and strontium, bismuth and tantalum for the ferroelectric, or an alkoxide of the metal with a carboxylic acid, or with a carboxylic acid and an alcohol, and dissolving the reactant in a solvent. Carboxylic acids that may be used include 2-ethylhexanoic acid, octanoic acid, and neodecanoic acid, preferably 2-ethylhexanoic acid. Alcohols that may be used include 2-methoxyethanol, 1-butanol, 1-pentanol, 2-pentanol, 1-hexanol, 2-hexanol, 3-hexanol, 2-ethyl-1-butanol, 2-ethoxyethanol, and 2-methyl-1-pentanol, preferably 2-methoxyethanol. Solvents that may be used include xylenes, -octane, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1, 3, 5 trioxane, isobutyl isobutyrate, isobutyl propionate, propyl propionate, ethyl lactate, n-butanol, n-pentanol, 3-pentanol, toluene, ethylbenzene, 1-butanol, 1-pentanol, 2-pentanol, 1-hexanol, 2-hexanol, 3-hexanol, 2-ethyl-1-butanol, 2-ethoxyethanol, and 2-methyl-1-pentanol, as well as many others. The metal, metal alkoxide, acid, and alcohol react to form a mixture of metal-alkoxocarboxylate, metal-carboxylate and/or metal-alkoxide, which mixture is heated and stirred as necessary to form metal-oxygen-metal bonds and boil off any low-boiling point organics that are produced by the reaction.

In the preferred embodiment, cerium oxide, $CeO_2$, is used as insulator 52. For the FETs for which experimental results are presented below, a commercially available cerium 2-ethylhexanoate in 2-ethylhexanoic acid was used, i.e. 12.08 weight percent Ce available from Strem Company (Lot No. 136599-S). An amount of this solution equal to 23.2042 grams was weighed into a 125 ml (milliliter) Erlenmeyer flask and 75 ml of n-octane was added. This was stirred at room temperature to dissolve the cerium compound in the n-octane, which formed a pale yellow solution immediately. Next, this solution was poured into a 250 ml graduated cylinder and diluted to 200.0 ml with additional n-octane. This solution was then filtered through a 0.2 micron filter into a 250 ml bottle to form the final cerium precursor. Other insulators may be used, such as yttrium oxide and lanthanum oxide.

In the preferred embodiment, a layered superlattice material, such as described in U.S. Pat. No. 5,519,234 issued May 21, 1996 to Carlos A. Paz de Araujo, et al., and U.S. Pat. No. 5,434,102 issued on Jul. 18, 1995 to Watanabe, et al., is used. The typical precursor for making layered superlattice materials currently preferred by those skilled in the art has the stoichiometric formula $SrBi_{2.18}Ta_{1.44}Nb_{0.56}O_9$. This precursor includes about 9% excess bismuth. That is, the standard stoichiometric formula includes an amount of bismuth above what is required to bond with all the strontium, tantalum and niobium in the precursor to form a layered superlattice compound with all atomic sites in the crystal occupied. As explained in the above patents, strontium is considered to be an "A-site" element in the above formula and tantalum and niobium are considered "B-site" elements, while the bismuth is the superlattice generator element. One feature of the invention is that a final layered superlattice compound with excess B-site and/or superlattice generator metals has a lower dielectric constant and is therefore preferred as the ferroelectric. Put another way, A-site poor, that is, A-site deficient compounds, are preferred. Specifically, the most preferred materials are strontium poor strontium bismuth tantalate and strontium bismuth tantalum niobate. In the experimental examples discussed below, however, strontium bismuth tantalate having the final formula $SrBi_2Ta_2O_9$ was used. The electrode 56 is preferably platinum, but may be other metals or conductors also.

Figures 7, 8, 9, 10, 11, 12:
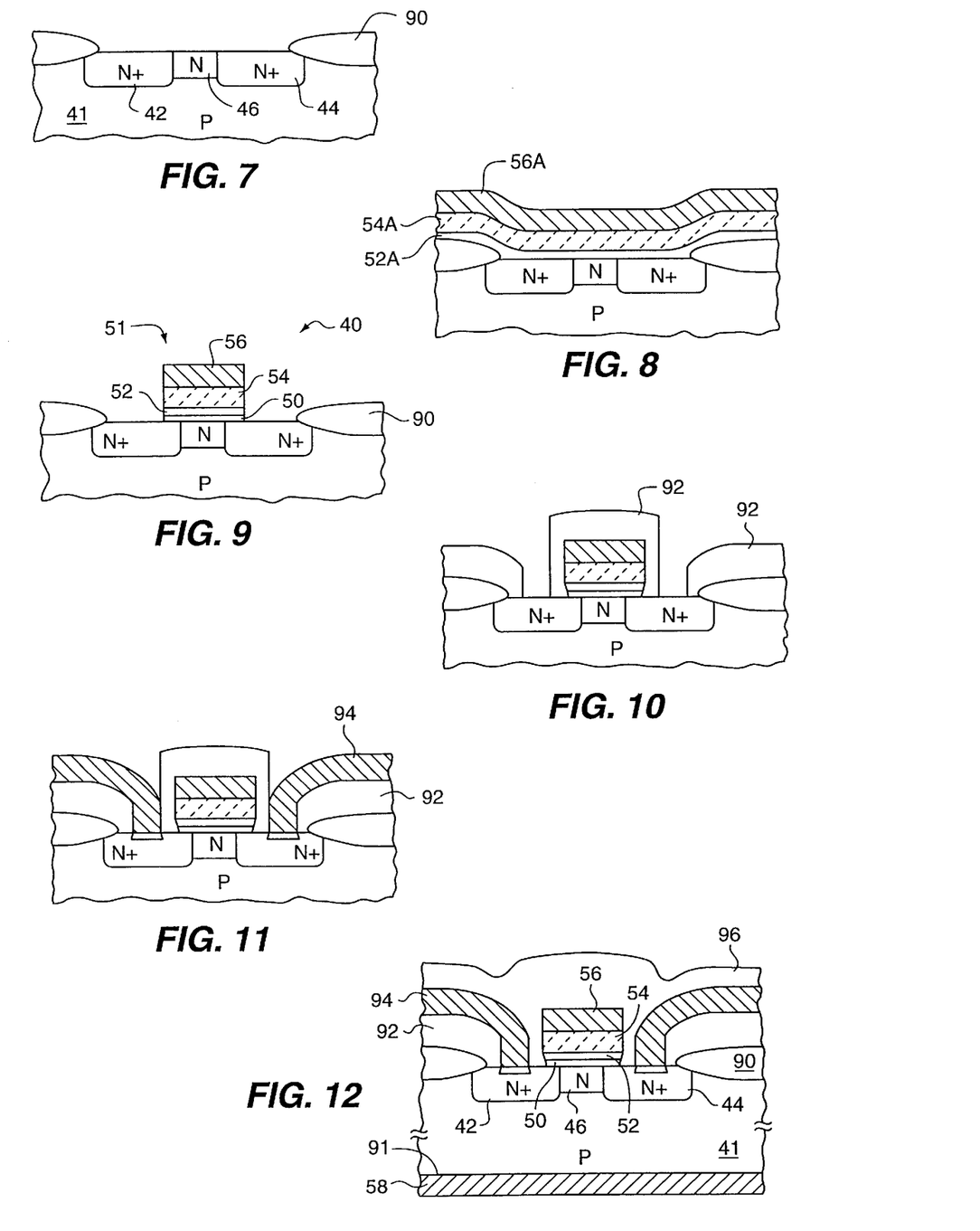
FIGS. 7–12 are cross-sectional views of a ferroelectric FET according to the invention in progressive stages of fabrication.

Turning to FIG. 8, the insulator thin film 52A and ferroelectric thin film 54A are preferably applied using a liquid deposition technique, such as spin-coating or a misted deposition method as described in U.S. Pat. No. 5,546,945 issued Oct. 10, 1995 to Larry D. McMillan, et al. In the examples discussed below, a spin-on technique was used to form the thin films. The technique of deposition, drying, and rapid thermal processing (RTP) as described in the above patents was performed for one layer of cerium oxide to form the insulator 52, while the same deposition technique for five layers was used to form the strontium bismuth tantalate. After deposition, drying and RTP, in step 616 the cerium oxide film 52A on the substrate was annealed at 800° C. for 1.5 hours in oxygen. The ferroelectric layer 54A was then deposited in step 622 as discussed above, and then electrode layer 56A was formed by sputtering platinum in step 624. The wafer was then annealed in a second anneal step 628 at 800° C. for one hour in oxygen.

Proceeding to FIG. 9, the gate region 51 of the FET 40 is now patterned in steps 630, 632, and 634. Preferably, a photo resist (P.R.) is deposited in step 630, developed using a mask, then the electrode 56, ferroelectric 54 and insulator 52 are defined by ion milling in step 632 followed by ashing in step 634. The patterned gate region 51 is then annealed again in step 635 in an oxygen furnace at 800° C. for 30 minutes. In the annealings subsequent to the cerium oxide deposition, a natural oxide layer 50 is formed.

The relative thicknesses of the layers 50, 52, and 54, particularly 50 and 52, is important. Preferably, the natural oxide is from 2 nm to 8 nm thick, the insulator 52 is from 15 nm to 35 nm thick, and the ferroelectric material 54 is from 20 to 400 nm thick. For the specimens discussed below, the natural oxide 50 was 4.0 nm thick, the insulator 52 was 25.0 nm thick, the ferroelectric 54 was 380 nm thick, and the electrode 56 was 400 nm thick.

As shown in FIG. 10, an interlayer dielectric 92, preferably SOG (spin-on-glass), is formed in step 636, and then patterned in steps 637, 638, and 639 to form the holes for the source/drain contacts. The metallization is then deposited in step 644. The metallization is patterned in steps 646, 648, and 650, followed by another anneal, which is preferably performed at 800° C. for 30 minutes. The back side or bottom 91 of the wafer 41 is then metallized in step 660, preferably with an aluminum layer 58. The FET 40 and memory 330 (FIG. 33) is then completed with a conventional capping layer 96 and packaging in step 670.

3. Measured Electronic Parameters

Figure 13:
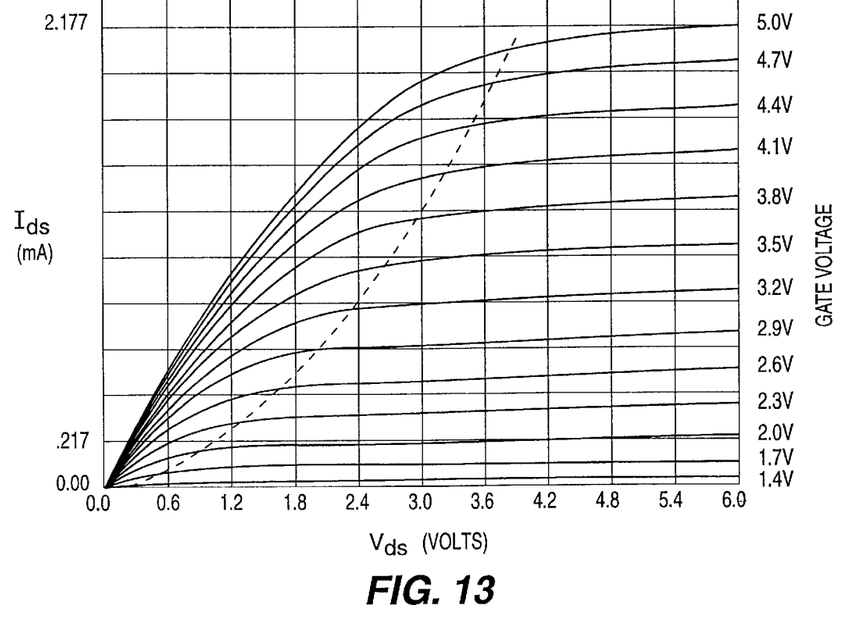
FIG. 13 is a graph of drain to source current verses drain voltage for various gate voltages measured for a ferroelectric FET according to the invention after a positive pulse was applied to the ferroelectric material.

Numerous examples of FETs fabricated as indicated above were tested with the results shown in FIGS. 13–27. FIG. 13 is a graph of drain to source current in milliamps (ma) verses drain to source voltage in volts for various gate voltages measured after a positive pulse was applied to the ferroelectric material. The positive pulse was a pulse of 5 ns rise time and 60 ns period whose amplitude was swept from zero to 4.53 volts while applying a D.C. gate bias voltage of 1.2 volts. The drain voltage was then swept from zero to six volts while applying various gate voltages from 5 volts to 0.5 volts, which are given in volts along the right hand side. The gate voltage was decreased in 0.3 volt steps. The dashed line indicates the locus of lds(sat) versus Vd(sat) and thus separates the linear and saturation regions. In the linear region, lds increases linearly with Vd for a given Vg. When the drain voltage is increased to a point such that the charge in the inversion layer becomes zero, the number of mobile electrons at the drain experiences a drastic fall-off. At this point, called the pinch-off, the drain current becomes saturated. The pinch-off point and the saturation current decreases as the gate voltage decreases. Though not shown in the figure, because of the scale, when the gate voltage dropped below the negative threshold voltage of 0.8V, the current dropped three orders of magnitude.

Figure 14:
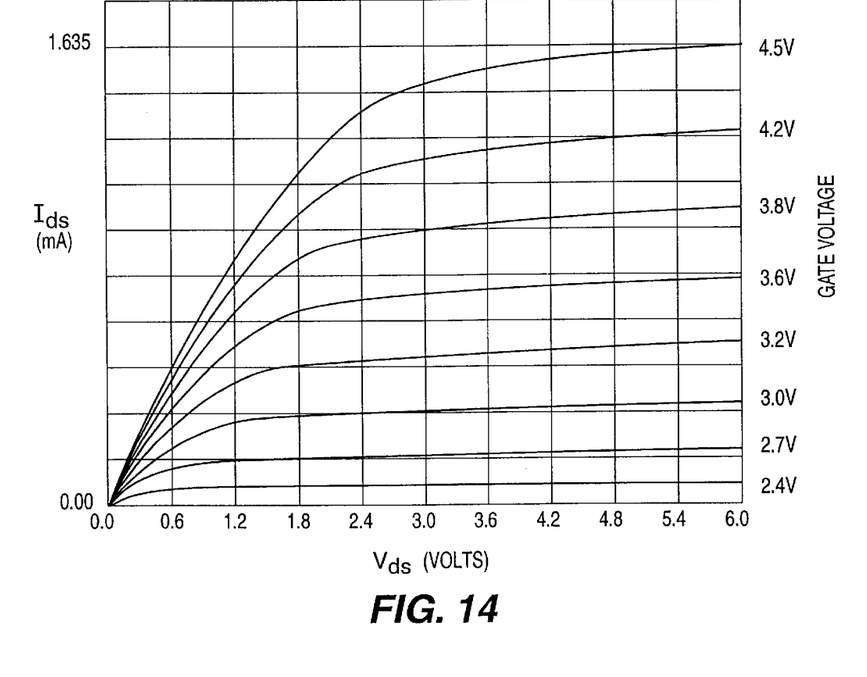
FIG. 14 is a graph of drain to source current version drain voltage for various gate voltages measured for a ferroelectric FET according to the invention after a negative pulse was applied to the ferroelectric material.
Figure 15:
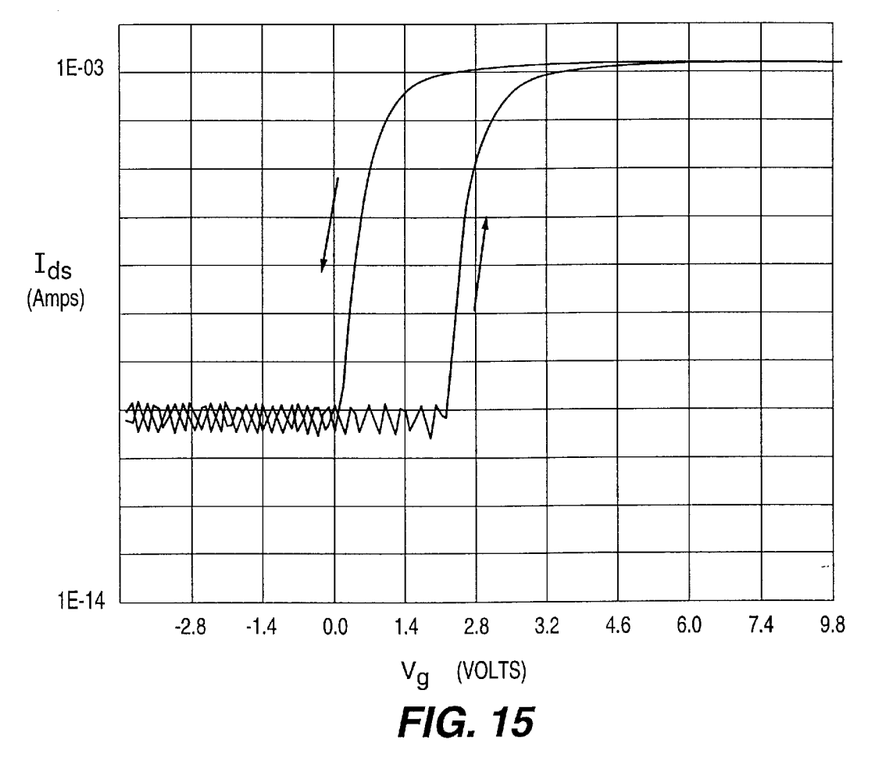
FIG. 15 is a graph of drain to source current versus gate voltage measured for a ferroelectric FET according to the invention.

FIG. 14 is a graph of drain to source current in milliamps versus drain voltage in volts for various gate voltages measured for a ferroelectric FET after a negative pulse was applied to the ferroelectric material. The negative pulse was a pulse of 5 ns rise time and 60 ns period whose amplitude was swept from zero volts to 6.56 volts while applying a D.C. gate bias voltage of 1.2 volts. The drain voltage was then swept from zero volts to six volts while applying various gate voltages, from zero volts to 4.5 volts, which are given in volts along the right hand side. The gate voltage was increased in 0.3 volt steps. Though not shown in the graph because of the scale, when the gate voltage was increased beyond the positive threshold voltage of 1.8 volts, Ids increased by three orders of magnitude, i.e. three decades. The memory window for this FET is shown in FIG. 15, which is a graph of drain to source current in amperes (Amps) versus gate voltage in volts. The D.C. gate bias was swept from −10 volts to +10 volts and back to generate this graph. The memory window is approximately 2.1 volts and the center of the window is at approximately one volt. The difference between the ON current and the OFF current is eight decades; thus these states are easily distinguishable.

Figure 16:
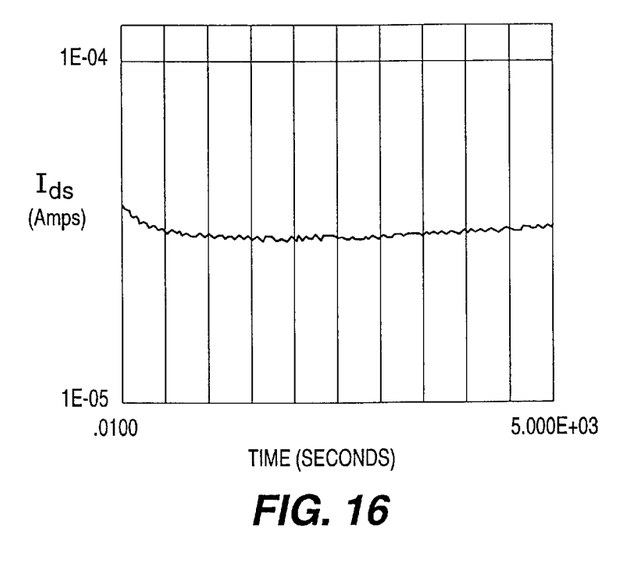
FIG. 16 is a graph of drain to source current versus time measured for a ferroelectric FET according to the invention after a positive pulse was applied to the gate and with a DC bias of 1.6 volts applied during the measurement.

FIG. 16 is a graph of drain to source current in amperes versus time in seconds measured for a ferroelectric FET according to the invention after a positive pulse of 4.5 volts was applied to the gate for two seconds. During the measurement, Vd was at one volt and D.C. bias of 1.6 volts was applied to the gate. After a 3% decay during the first two minutes, the source drain current remained essentially unchanged for 5000 seconds, or about 1.4 hours. Another measurement was made after 17 hours, and the source drain current was unchanged. Thus, this suggests that the data can be held essentially indefinitely.

In the above experiment, the gate bias was held at about 0.6 volts higher than the center of the memory window in FIG. 15. The reason for this is that the voltage pulse applied to program the FET was lower for the experiment of FIG. 16 than for the experiment of FIG. 15. The width of the memory window changes with the amplitude of the applied voltage pulse. The reason for this effect is not clear; the coercive voltage of the FET may be larger for a large signal than for a small signal.

Ideally, the center of the memory window should be at zero volts so that the stored signal will be kept indefinitely with no external power. The position of the memory window is sensitive to processing since it depends on the charge carriers in the silicon surface. Annealing in nitrogen moves the center of the memory window in the positive direction, while ion implantation with boron in the channel region 46 moves the center of the memory window in the negative direction. In the sample of FIGS. 15 and 16, the center of the memory window was at −0.3 volts prior to $N_2$ annealing but moved to +1.2 volts after $N_2$ annealing.

Figure 17:
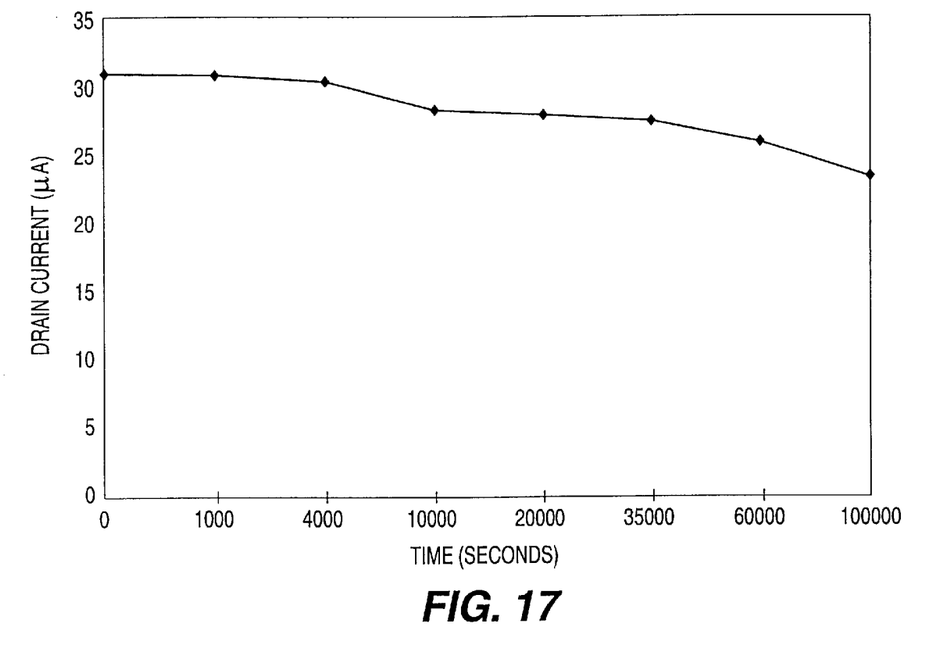
FIG. 17 is a graph of drain to source current versus time measured for a ferroelectric FET according to the invention after a positive pulse was applied to the gate and with a the gate open during the measurement.

FIG. 17 is a graph of drain to source current in microamps versus time in seconds measured for the ferroelectric FET sample of the above FIGS. after a positive pulse of five volts was applied to the gate and with the gate open during the measurement. In this instance, the drain current decays from an initial current of 31 microamps to 23.5 microamps after 100,000 seconds, or about 28 hours. This result appears to be due to a conductance decay in channel 46. Since for this sample and voltage pulse the ration of Ids(on) to Ids(off) is about ten decades, the FET can be read at least for $10^6$ seconds, or about ten days.

Figure 18:
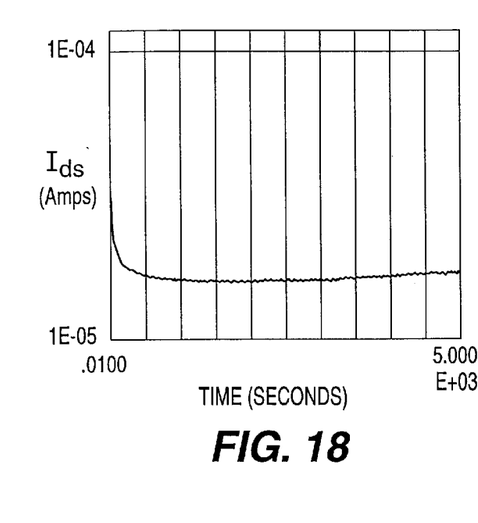
FIG. 18 is a graph of drain to source current versus time measured for a ferroelectric FET according to the invention after a negative pulse was applied to the gate, with a DC bias of 1.2 volts applied during the measurement, and with the FET illuminated with light.
Figure 19:
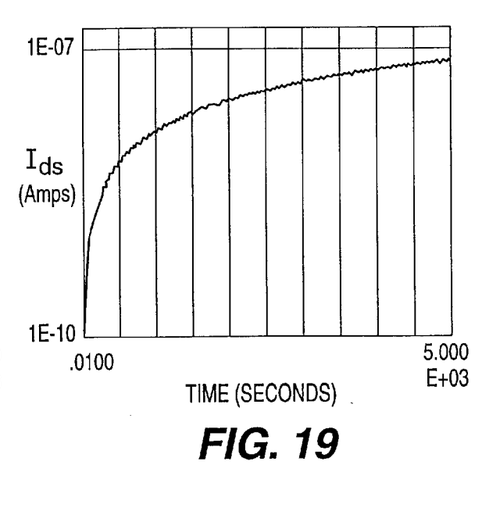
FIG. 19 is a graph of drain to source current versus time measured for a ferroelectric FET according to the invention after a positive pulse was applied to the gate, with a DC bias of 1.6 volts applied during the measurement, and with the FET illuminated with light.
Figure 20:
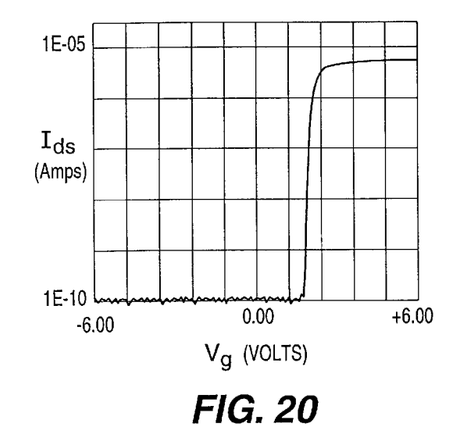
FIGS. 20–23 are graphs of drain to source current versus gate voltage when the gate voltage is swept from negative to positive for substrate biases of 0 volts, –2.0 volts, 0.3 volts, and 0.8 volts, respectively.
Figure 21:
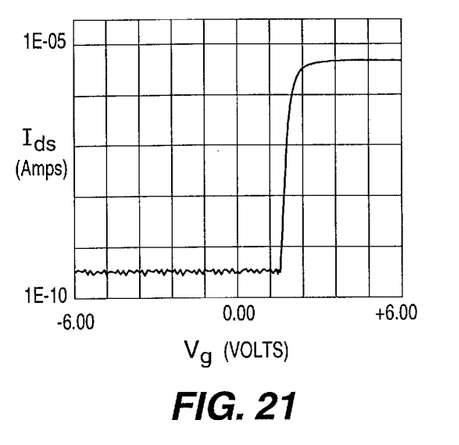

FIGS. 18 and 19 show the effect of light on the drain to source current of FET 40. FIG. 18 is a graph of drain to source current in amps versus time in seconds measured for a ferroelectric FET according to the invention after a positive pulse was applied to the gate, with a D.C. bias of 1.6 volts applied during the measurement, and with the FET illuminated with light; and FIG. 19 is a graph of drain to source current in amps versus time in seconds measured for a ferroelectric FET according to the invention after a negative pulse was applied to the gate, with a D.C. bias of 1.2 volts applied during the measurement, and with the FET illuminated with light. When the FET is in the ON state, that is, after the positive pulse, the drain to source current decreases exponentially about 30% after about 100 seconds and then is flat. When the FET is in the OFF state, that is, after the negative pulse, the drain to source current increases exponentially about three orders of magnitude after 5000 seconds. Thus, the memories should be capped to prevent any effect on performance due to illumination.

Figure 22:
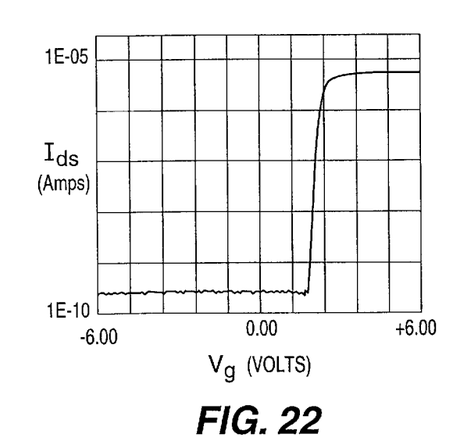
Figure 23:
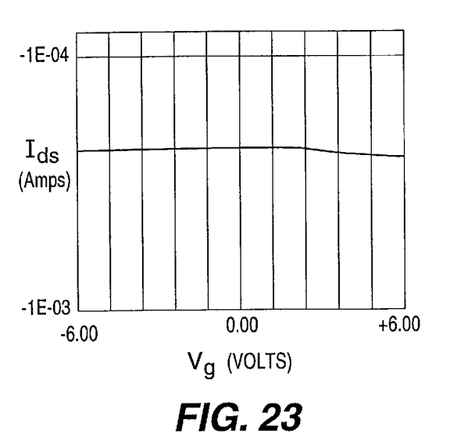
Figure 24:
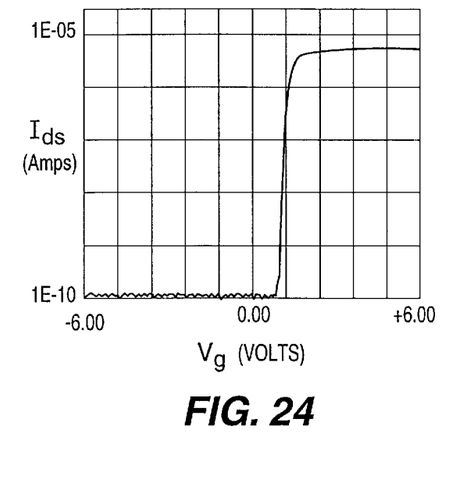
FIGS. 24–27 are graphs of drain to source current versus gate voltage when the gate voltage is swept from positive to negative for substrate biases of 0 volts, –2.0 volts, 0.3 volts, and 0.8 volts, respectively.
Figure 25:
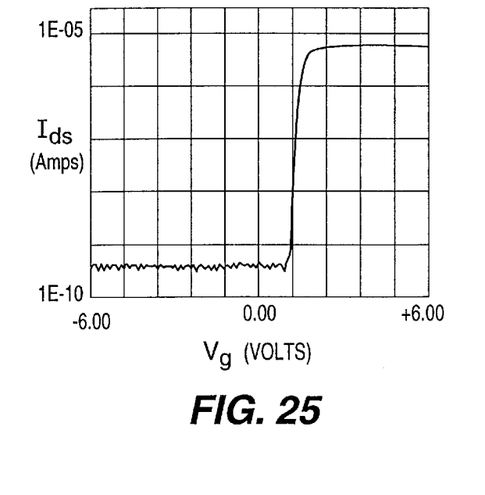
Figure 26:
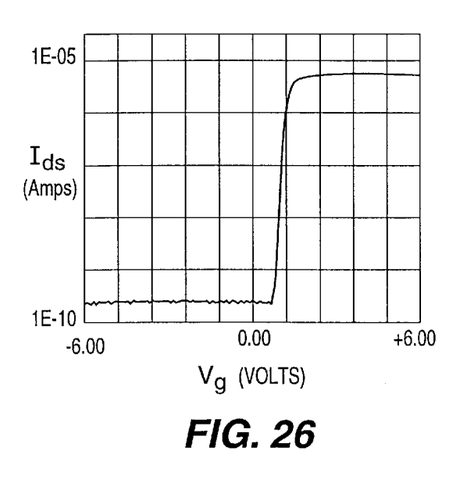
Figure 27:
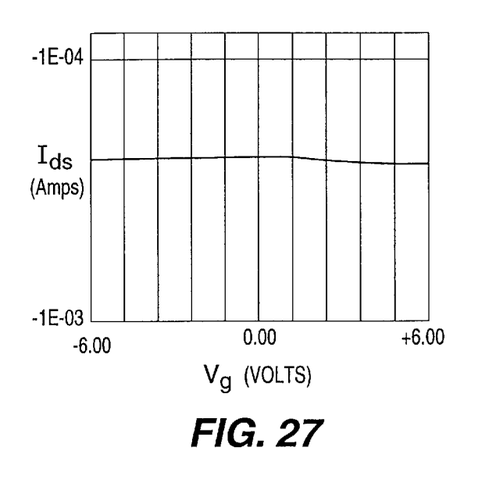

An important discovery of the invention is that the substrate bias strongly affects the drain to source current, the threshold voltages and the memory window. FIGS. 20–23 are graphs of drain to source current in amperes versus gate voltage in volts when the gate voltage is swept from a negative six volts to a positive six volts for substrate biases of zero volts, −2.0 volts, 0.3 volts, and 0.8 volts, respectively, and FIGS. 24–27 are graphs of drain to source current in amperes versus gate voltage in volts when the gate voltage is swept from a positive six volts to a negative six volts for substrate biases of zero volts, −2.0 volts, 0.3 volts, and 0.8 volts, respectively. When the gate voltage is swept from negative to positive (FIGS. 20–23), negative substrate bias results in the decrease of +Vth (FIG. 21) and small positive substrate bias results in the increase of +Vth (FIG. 22). When the gate voltage is swept from positive to negative (FIGS. 24–27), negative substrate bias results in the increase of −Vth (FIG. 25), and small positive substrate bias results in the decrease of −Vth (FIG. 26). In otherwords, positive substrate bias increases the memory window from 0.9 volts to 1.1 volts and negative substrate bias decreases the memory window from 0.9 volts to 0.6 volts. This effect should be much larger with increased channel doping. Importantly, when the positive substrate bias is over 0.6 volts, which is the minimum value of the surface potential, Ids becomes negative (FIGS. 23 and 27).

Based on the above, a truth table for writing to a memory 280 (FIG. 32) can be constructed. If Vss is the bias voltage between the substrate and the source, for the select line (Sel0, Sel1, etc.) applying the substrate bias voltage we can define a logic "0" state as the state in which Vss>0.8 volts and a logic "1" state as the state in which Vss<0.8 volts. Likewise, for the write/erase (W/E) signal applied to the word line (W0, W1, etc.), we can define a logic "0" as the state where Vg=−5 volts to −10 volts, and a logic "1" where Vg=+5 volts to +10 volts. Finally, we can define a resultant logic state for Ids as follows: we define the states where Ids is either negative or very small positive, i.e. of the order of nanoamps, as a logic "0"; we define the state were Ids is relatively large and positive, i.e. on the order of microamps to milliamps as the logic "1" state. The truth table, then, is as shown in Table 1.

TABLE 1

| Vss | W | Ids |
|-----|---|-----|
| 0 | 0 | 0 (<0) |
| 0 | 1 | 0 (<0) |
| 1 | 0 | 0 (>0, ~nA) |
| 1 | 1 | 1 (>0, µA –mA) |

The memory can be read by setting all voltages to zero except the drain voltage, and reading the drain current. If the drain current is negative or very small, i.e. in the range of microamps, then the state is a logic "0". If the drain current is positive and large, i.e. in the range of .01 milliamps or more, then the ferroelectric is in a logic "1".

3. Memory Architecture

Figure 28:
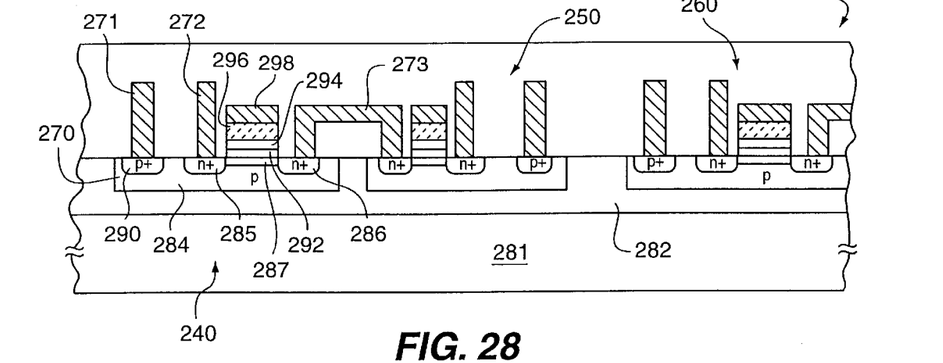
FIG. 28 is a cross-sectional view of a preferred embodiment of the ferroelectric memory according to the invention in which the source voltage is held to ground, a cell is written to by altering the substrate bias, and the substrate contact is located on the upper surface of the substrate.

The results discussed above show that the relative bias voltage between the substrate and source can be used to select and deselect a cell in an array of memory cells that utilize the FET 40. FIG. 28 is a cross-sectional view of a preferred embodiment of the ferroelectric FET 280 according to the invention in which the substrate bias voltage is varied to select a cell or group of cells. Integrated circuit memory 280 is formed on a wafer 281 which is preferably p-type silicon. An insulation layer 282, preferably silicon oxide, is formed on wafer 281, and then wells, such as 270, are formed in the insulator 282. An epitaxial semiconductor 284, preferably epitaxial silicon, is formed in wells 270. In and on each well 270 a FET, such as 240, 250 and 260, is fabricated. As discussed above, source/drains 285 and 286 and channel 287 are formed. In addition, a p+ doped area 290 is formed to be the contact region for the substrate 281. Then a natural oxide layer 292, an insulating layer 294, a ferroelectric layer 296 and an electrode 298 are formed as discussed above. Wiring layers 271, 272 and 273 are then formed to carry signals to the substrate contact area 290, source/drain 285 and source/drain 286. In this embodiment, all source/drain 286 is the source and all sources are held at the same voltage. So that one wiring layer portion 273 can serve two adjoining cells, the neighboring FET cell 250 is the mirror image of FET cell 240. In this embodiment, for each column of cells there is a complementary column that is read out at the same time, but using a different senses amp. The invention contemplates other embodiments in which the source wiring layers for adjoining cells are independent. In this embodiment, the substrate contact 271 is located on the upper surface of the substrate 284. Thus, FIG. 28 shows a first ferroelectric FET 240 having a first semiconducting substrate 284, a second ferroelectric FET 250 having a second semiconducting substrate 295, and a third ferroelectric FET 260 having a third semiconducting substrate 297.

Figure 29:
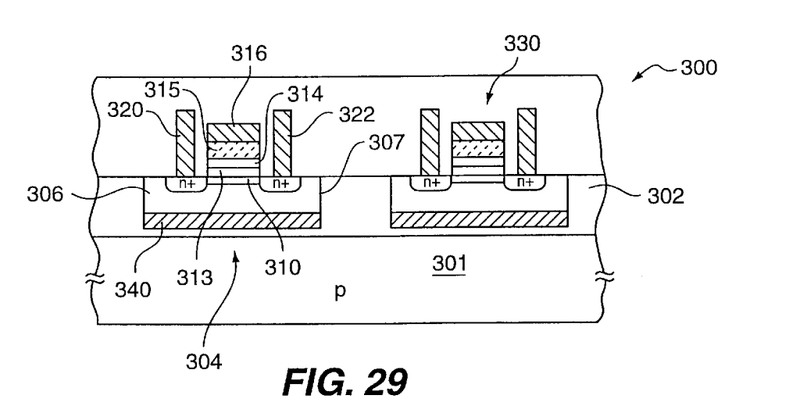
FIG. 29 is a cross-sectional view of a preferred embodiment of the ferroelectric memory according to the invention in which the substrate is held to ground, a cell is written to by altering the source bias instead of the substrate bias, and the substrate contact is located on the lower surface of the substrate.

FIG. 29 shows a cross-sectional view of an alternative embodiment of a portion of a ferroelectric memory 300 according to the invention. In this embodiment, the substrate contact 340 is located on the lower surface of the substrate 306. In this embodiment, an insulator 302 is again formed on a wafer 301, and wells 307 are formed in the insulator 302. Substrate conductors 340 are deposited in the wells 302, then epitaxial semiconductor layers 306 are formed in wells 307 and FETS, such as 304, 330 including source/drains 308, 309, channel 310, natural oxide 313, insulating layer 314, ferroelectric 315, and electrode 316, are formed in and on epitaxial semiconductor 306 in the manner described above. Wiring layers 320 and 322 provide signals to the source/drains 308 and 309, respectively.

Figure 30:
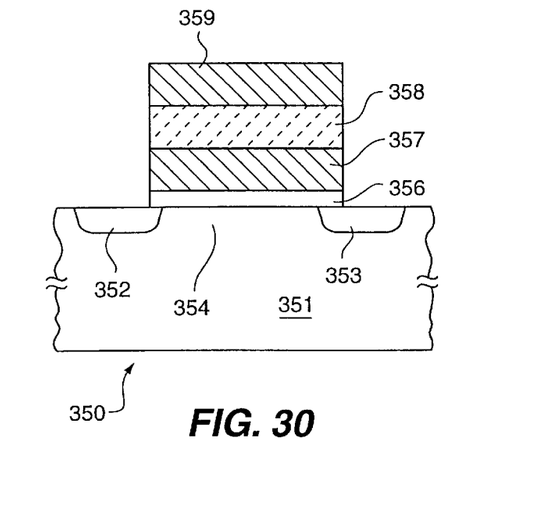
FIG. 30 illustrates a MFMISFET according to the invention.
Figure 31:
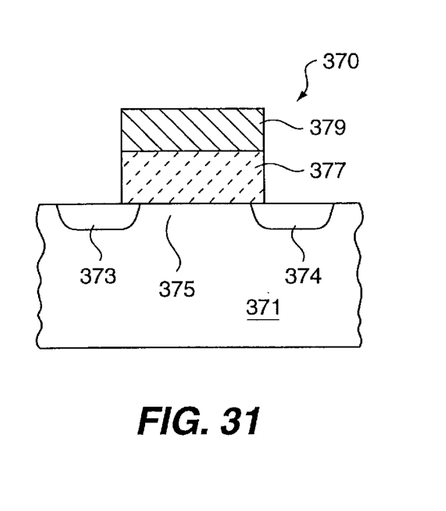
FIG. 31 illustrates a MFSFET according to the invention.

Other embodiments of the integrated circuit memory according to the invention are possible. For example, in the embodiment of FIG. 28, a metallization layer could be put at the bottom of each well 270 to serve as the substrate contact, rather than putting the contact on the surface of the epitaxial layer 284. FIG. 30 shows a MFMISFET which can also serve as the FET to implement the invention. This FET is again formed on a semiconductor 351, and includes source/drains 352 and 353, channel 354, insulating layer 356, ferroelectric 358, and electrode 359, but also includes a floating gate electrode 357. Insulating layer 356 can be a single insulating layer or multiple insulating layers as discussed above. Contacts, wiring layers and other architecture can take on any of the forms shown or discussed above. FIG. 31 shows a MFSFET that can also serve as the FET to implement the invention. This FET is again formed on a semiconductor 371, and includes source/drains 373 and 374, channel 375, ferroelectric 377, and electrode 379, but does not include the additional insulating layers between the ferroelectric 377 and the semiconductor. Contacts, wiring layers and other architecture can take on any of the forms shown or discussed above.

Figure 32:
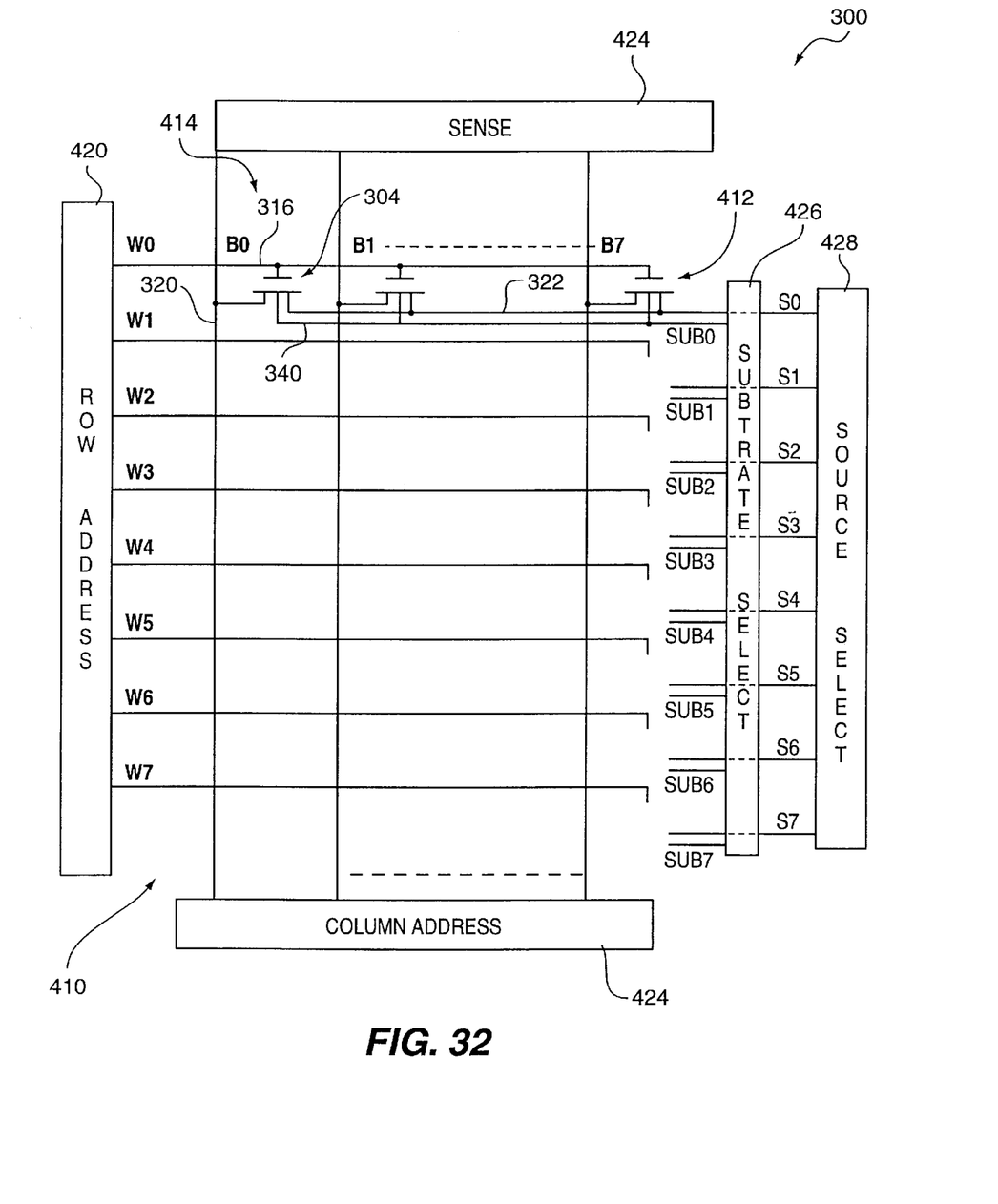
FIG. 32 shows a block electrical diagram of one preferred embodiment of a memory array according to the invention.

FIG. 32 shows a block electrical diagram of a memory 300 utilizing the cell structure of FIG. 29. The memory 300 includes an array 410 of rows, such as 412, and columns, such as 414, of FET memory cells, such as 304. The cell 304 and lines 316, 320, 322, and 340 are numbered the same as in FIG. 29 for easy identification. Memory 300 also includes a row address decoder 420, a column address decoder 422, a sense amplifier 424, a substrate select circuit 426, and a source select circuit 428. The row address decoder is connected to the word lines W0, W1 . . . W7, with each of the eight word lines connected to all the gates of the FETs in a different row. The column address decoder 422 is connected to the bit lines, B0, B1 . . . B7, with each of the eight bit lines connected to the drain of each FET in a different column. The sense amplifier 424 is connected to the bit lines B0, B1 . . . B7 also. The substrate select circuit 426 is connected to the substrate select signal lines Sub0, Sub1 . . . Sub7. Each of the substrate select signal lines is connected to the substrate, such as 306, of each cell in a row. The source select circuit 428 is connected to the eight source select lines S0, S1 . . . S7. Each source select line is connected to the source, such as 309, of each cell in a row. The invention contemplates many other embodiments related to the embodiment of FIG. 32. For example, the column address decoder could be connected to the gate of each FET in a column and the row address decoder could be connected to the drain of each FET in a row. The sense amplifier could alternatively be connected to the source of each FET. The source select circuit 428 could alternatively have one line for each column and be located near the column address decoder 422. The sense amplifier 424 and column address decoder 422 could be located on the same side of the array 410. For simplicity, the memory 300 shown is an 8×8 memory, that is a 64 bit memory; though, as known in the art, it can be made in much larger sizes.

An exemplary truth table that may be used for writing to memory 300 is shown in Table 2. In the preferred embodiment, all cells in a single row are addressed at the same time. That is, one byte is written to or read at the same time. The writing operation begins with a reset in which all voltages are set to zero except the word line of the row to be written to, which is set to a negative voltage of from about −3 volts to −10 volts. This sets all cells to a logic "0". This operation is performed once just before the writing of data to a row. Then the row is written to by setting all source select lines, S1, S2 . . . S7, to a logic "1", i.e. a voltage of 0.8 volts. The word line of the selected row, say, W0, is set to a logic "1", that is, to a voltage of between +3 volts and +10 volts. The word line of the other rows, say W1 through W7, is set to a logic "0", that is, a voltage of zero volts. The substrate line, e.g. Sub0, of the row being written to is set to a logic "1", that is, a voltage of 0.8 volts, while the substrate lines of all the other rows, i.e. lines Sub1 through Sub7, are set to logic "0", i.e. zero volts. The drain voltages, that is, the bit line B0, B1 . . . B7 are then set to the desired logic state, either a logic "0", i.e. zero volts, or a logic "1", i.e. higher than 0.6 volts. A logic "1" is thus written to all the cells which have the bit line in the logic "1" state, and the other cells remain in the logic "0" state. For example, if in FIG. 32, B0, B2 and B4 are set equal to a logic "1", and B1, B3, B5, B6, and B7 are set to a logic "0", the data byte written to the row one is (10101000). A summary of these operations is shown in the form of a truth table in Table 2.

TABLE 2

| $V_S$ S | $V_B$ (Sub) | $V_G$ (W) | $V_D$ (B) | Data |
|---|---|---|---|---|
| 0 | 0 | 0 | 0 | (no change) |
| 0 | 0 | 0 | 1 | (no change) |
| 1 | 1 | 1 | 0 | 0 |
| 1 | 1 | 1 | 1 | 1 |

In the reading operation of memory 300, all the substrate voltages, Sub0, Sub1 . . . Sub7, are set to ground, and all the word line voltages, W0, W1 . . . W7, are set to a small positive voltage, such as 0.2 volts, or to ground, the bit lines are set to a logic "1", i.e. 0.8 volts, and the row to be read is selected by the source select circuit 428. The source select signal of the row to be read, say, S0, is set to zero volts, while the source select signals of all the other rows, say S1 . . . S7, are set to 0.8 volts. The state of the cells in the selected row is then read out by the sense amplifier 424 by reading the current on the bit lines B0, B1 . . . B7. In the "holding" state, all sources and all drains are set to a logic "1" or 0.8 volts.

Figure 33:
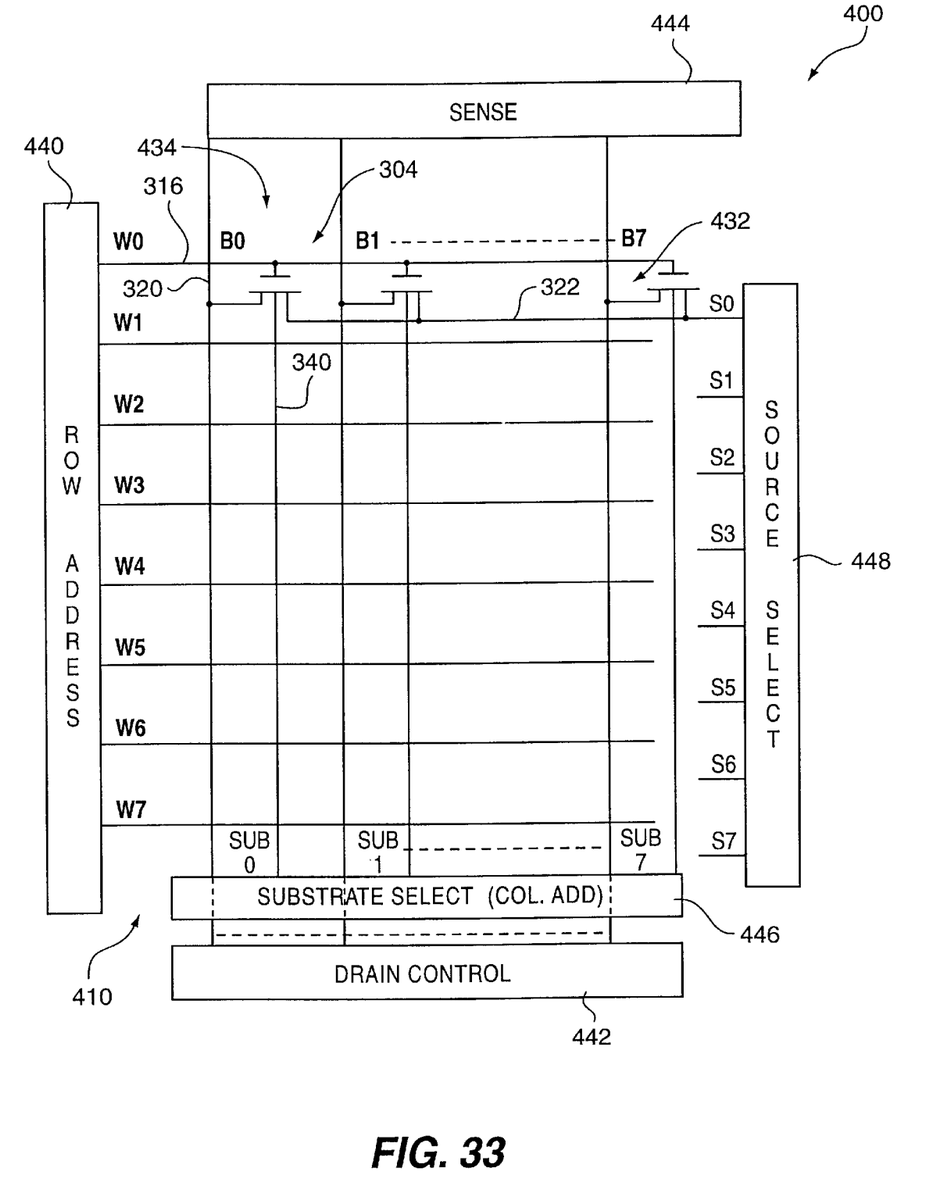
FIG. 33 shows a block electrical diagram of another preferred embodiment of a memory array according to the invention.

FIG. 33 shows a block electrical diagram of an alternative memory 400 utilizing the cell structure of FIG. 29. The memory 400 includes an array 410 of rows, such as 432, and columns, such as 434, of FET memory cells, such as 304. The lines 316, 320, 322, and 340 are numbered the same as in FIG. 29 for easy identification. Memory 400 also includes a row address decoder 440, a drain control circuit 442, a sense amplifier 444, a substrate select circuit 446, and a source select circuit 448. The row address decoder is connected to the word lines W0, W1 . . . W7, with each of the eight word lines connected to all the gates of the FETs in a different row. The drain control circuit 422 is connected to the bit lines, B0, B1 . . . B7, with each of the eight bit lines connected to the drain of each FET in a different column. The sense amplifier 424 is connected to the bit lines B0 B1 . . . B7, also. The substrate select circuit 426 is connected to the substrate select signal lines Sub0, Sub1 . . . Sub7. Each of the substrate select signal lines is connected to the substrate, such as 306, of each cell in a row. The source select circuit 428 is connected to the eight source select lines S0, S1 . . . S7. Each source select line is connected to the source, such as 309, of each cell in a row. Again, the invention contemplates many other embodiments related to the embodiment of FIG. 33, and for simplicity, the memory 400 shown is an 8×8 memory, that is, a 64 bit memory; though, as known in the art, it can be made in much larger sizes.

An exemplary truth table that may be used for writing to memory 400 is shown in Table 3. Again, in the preferred embodiment, all cells in a single row are addressed at the same time. That is, one byte is written to or read at the same time. The writing operation begins with a reset operation that is identical to the reset operation described above for the embodiment of FIG. 32. Then the row is written to by setting all bit lines, B1, B2 . . . B7, to a logic "1", i.e. a voltage of 0.8 volts. The word line of the selected row, say, W0, is set to a logic "1", that is, to a voltage of between +3 volts and +10 volts. The word line of the other rows, say W1 through W7, is set to a logic "0", that is, a voltage of zero volts. The source select line, e.g. S0, of the row being written to is set to a logic "0", that is, a voltage of zero volts, while the source select lines of all the other rows, i.e. lines S1 through S7, are set to logic "1", i.e. 0.8 volts. The substrate voltages, that is, the lines Sub0, Sub1 . . . Sub7, are then set to the desired logic state, either a logic "0", i.e. a voltage greater than 0.6 volts, or a logic "1", i.e. a voltage less than 0.6 volts. A logic "1" is thus written to all the cells which have the substrate select signal line in the logic "1" state, and the other cells remain in the logic "0" state. For example, if in FIG. 33, Sub0, Sub2 and Sub4 are set equal to a logic "1" and Sub1, Sub3, Sub5, Sub6, and Sub7 are set to a logic "0", the data byte written to the row one is (01010111). A summary of these operations is shown in the form of a truth table in Table 3. In this truth table, we use a "−Vs" which is the inverse of Vs.

TABLE 3

| −$V_S$ S | $V_B$ (Sub) | $V_G$ (W) | $V_D$ (B) | Data |
|---|---|---|---|---|
| 0 | 0 | 0 | 1 | (no change) |
| 0 | 1 | 0 | 1 | (no change) |
| 1 | 0 | 1 | 1 | 0 |
| 1 | 1 | 1 | 1 | 1 |

The reading operation of memory 400 and the holding operation are the same as described above for the memory 300.

There have been described what are at present considered to be the preferred embodiments of the invention. It will be understood that the invention can be embodied in other specific forms without departing from its spirit or essential characteristics. Now that the possibility and advantages of utilizing a bias voltage to select memory cells has been shown, many modifications and variations of this principle may be devised. The present embodiments are, therefore, to be considered as illustrative and not restrictive. The scope of the invention is indicated by the appended claims.

We claim:

1. A ferroelectric memory comprising a first ferroelectric FET having a first channel region in a first semiconducting substrate and second ferroelectric FET having a second channel region in a second semiconducting substrate, said memory further including a substrate insulator essentially completely insulating said first semiconducting substrate from said second semiconducting substrate.

2. A ferroelectric memory as in claim 1 wherein said memory comprises an array of rows and columns of said ferroelectric FETs, each of said FETs having a semiconducting substrate, and said insulator insulates each of said semiconducting substrates from all of the other semiconducting substrates.

3. A ferroelectric memory as in claim 1 and further including an electrical contact to each of said semiconducting substrates.

4. A ferroelectric memory as in claim 3 wherein said electrical contact comprises a doped area in said semiconducting substrate and a conductor in electrical contact with said doped area.

5. A ferroelectric memory as in claim 3 wherein said memory includes a plurality of wells in said insulator and said contact comprises a conductive layer in each of said wells.

* * * * *